United States Patent [19]

Katagiri

[11] 4,139,774
[45] Feb. 13, 1979

[54] APPARATUS FOR IRRADIATING A SPECIMEN BY AN ELECTRON BEAM

[75] Inventor: Shinjiro Katagiri, Katsuta, Japan

[73] Assignee: Hitachi, Ltd., Japan

[21] Appl. No.: 872,762

[22] Filed: Jan. 27, 1978

[30] Foreign Application Priority Data

Feb. 9, 1977 [JP] Japan .................................. 52-13835
Feb. 10, 1977 [JP] Japan .................................. 52-13015

[51] Int. Cl.$^2$ ............................................ H01J 37/16
[52] U.S. Cl. .................................... 250/441; 250/457; 250/310; 250/492 A
[58] Field of Search ............... 250/311, 441, 457, 289, 250/310, 492 A, 305; 313/7, 174, 180

[56] References Cited

U.S. PATENT DOCUMENTS

| | | | |
|---|---|---|---|
| 2,284,710 | 6/1942 | Zworykin et al. | 250/441 |
| 3,233,823 | 2/1966 | Asamaki | 313/7 |
| 3,401,345 | 9/1968 | Petersilka et al. | 313/7 |
| 3,668,393 | 6/1972 | Ranch | 250/457 |

Primary Examiner—Bruce C. Anderson
Attorney, Agent, or Firm—Craig & Antonelli

[57] ABSTRACT

A specimen chamber is which a specimen to be irradiated by an electron beam is arranged is evacuated by an evacuation device. The evacuation device includes a nonvaporative bulk getter vacuum pump and an oil rotary pump. The oil rotary pump is used for evacuating the specimen chamber from the atmospheric pressure to $10^{-1} - 10^{-2}$ Torr, while the nonvaporative bulk getter vacuum pump is used for continuously evacuating the specimen chamber to $10^{-5} - 10^{-6}$ Torr. The steady vacuum of $10^{-5} - 10^{-6}$ Torr is maintained by only the nonvaporative bulk getter vacuum pump.

9 Claims, 10 Drawing Figures

APPARATUS FOR IRRADIATING A SPECIMEN BY AN ELECTRON BEAM

BACKGROUND OF THE INVENTION

1. Field of the Invention

This invention relates to apparatus for irradiating a specimen by an electron beam. More particularly, it relates to the apparatus suitable for use in an electron microscope, an electron probe X-ray microanalyzer, an Auger electron analyzing device and an electron-beam pattern drawing device.

2. Description of the Prior Art

In apparatus for irradiating a specimen by an electron beam, such as electron microscope, electron probe X-ray microanalyzer, Auger electron analyzing device and electron-beam pattern drawing device, it is important that the specimen is saved from staining. Although causes for the staining of the specimen are complicated, the main cause is deemed to lie in that hydrocarbon molecules adsorbed to the specimen form a layer which is stable both thermally and chemically, on the specimen in virtue of the irradiation by the electron beam. In order to prevent such stains of the specimen, attention has heretofore been turned to that a specimen chamber in which the specimen is accommodated is evacuated to the highest possible vacuum. From this viewpoint, a high vacuum pump such as oil diffusion pump and sputter ion pump is ordinarily used for maintaining the steady vacuum of the specimen chamber. These techniques are respectively disclosed in Japanese Pat. Publications Nos. 3224/74 and 48945/76.

However, oil vapor flows backwards into the specimen chamber from the oil diffusion pump. In substance, accordingly, the use of the oil diffusion pump does not serve to prevent the staining of the specimen. The oil diffusion pump also has the problem that it takes as long a time as about 20 - 30 minutes to steadily operate. When a trap for the oil vapor is interposed between the oil diffusion pump and the specimen chamber, the backward flow of the oil vapor into the specimen chamber is relieved, but the effect of preventing the backward flow is still unsatisfactory. In the case where the sputter ion pump is employed as the main evacuating pump, a higher degree of vacuum can be reached. On the other hand, however, it becomes a cause for the stains of the specimen that sputter substances produced within the pump adhere (deposit) onto the specimen. The adhesion of the sputter substances onto the specimen becomes more conspicuous as the sputter ion pump is brought nearer to the specimen for the purpose of keeping the vicinity of the specimen at a higher vacuum. Another problem is that ions and electrons produced within the sputter ion pump are captured as false signals by a detector for detecting information signals (of, for example, secondary electrons, reflected electrons, X-rays, cathode luminescence, Auger electrons, etc.) from the specimen.

SUMMARY OF THE INVENTION

An object of this invention is to provide apparatus for irradiating a specimen by an electron beam wherein the specimen is not stained under the state under which the specimen is put in a steady vacuum.

Another object of this invention is to provide apparatus for irradiating a specimen by an electron beam wherein the staining of the specimen can be prevented by a very simple construction.

Still another object of this invention is to provide apparatus for irradiating a specimen by an electron beam wherein a steady vacuum is attained in a short time.

Regarding the prevention of stains of a specimen, the concept that the stains of the specimen are prevented by establishing the highest possible vacuum has been common. In contrast, this invention is based on the concept that, even when the degree of vacuum is not very high, the problem of the stains of the specimen will be solved if the vacuum atmosphere is clean. Premised on such a concept and in view of the causes for the stains of the specimen, the inventor noted to arrange the specimen within an inert gas atmosphere having an adequate pressure, and took notice of a nonvaporative bulk getter vacuum pump. Although this vacuum pump is generally available commercially, it is not favored when to be employed singly as a main evacuating pump for the apparatus of the specified type because the degree of arrival vacuum is low. The inventor's notice of the nonvaporative bulk getter vacuum pump was based on the thought that, since the pump exploits the principle of chemical adsorption, argon and helium existent in the vicinity of the specimen will not be discharged by the pump. Under this thought, the inventor carried out an experiment of comparisons between a case of employing the nonvaporative bulk getter vacuum pump and a case of employing the oil diffusion pump as the main evacuating pump for the specimen chamber in which the specimen was received. Then, it was recognized that although the latter is desirable merely from the viewpoint of high vacuum, the former is far more excellent than the latter in point of the prevention of the stains of the specimen. More specifically, it could be perceived that the specimen staining rate in the former is only, at most, about 1/10 of that in the latter, and that the low staining rate comes from the fact that argon in an amount appropriate for the prevention of the stains of the specimen remains in the specimen chamber without being emitted.

According to this invention, means for generating an electron beam is disposed, and a specimen is irradiated by the particle beam. The specimen is arranged in a specimen chamber, which is kept in a steady vacuum state by only a nonvaporative bulk getter vacuum pump. The nonvaporative bulk getter vacuum pump is equipped with heating means for activation thereof.

According to such expedients of this invention, the staining of the specimen is prevented as stated previously. Moreover, since an oil diffusion pump or a sputter ion pump having heretofore been employed as a main evacuating pump is merely replaced with the nonvaporative bulk getter vacuum pump, the construction of this invention is simpler even when compared with that of the prior art of low stain preventive effect. Further, the nonvaporative bulk getter vacuum pump has the advantage that it takes only several tens seconds - several minutes to establish the steady vacuum. As the heating means for activation is comprised, the nonvaporative bulk getter vacuum pump can be used over a long term by utilizing it.

The other objects, advantages and features of this invention will become apparent from the following description taken with reference to the drawings.

DESCRIPTION OF THE PREFERRED EMBODIMENTS

Figure 1:
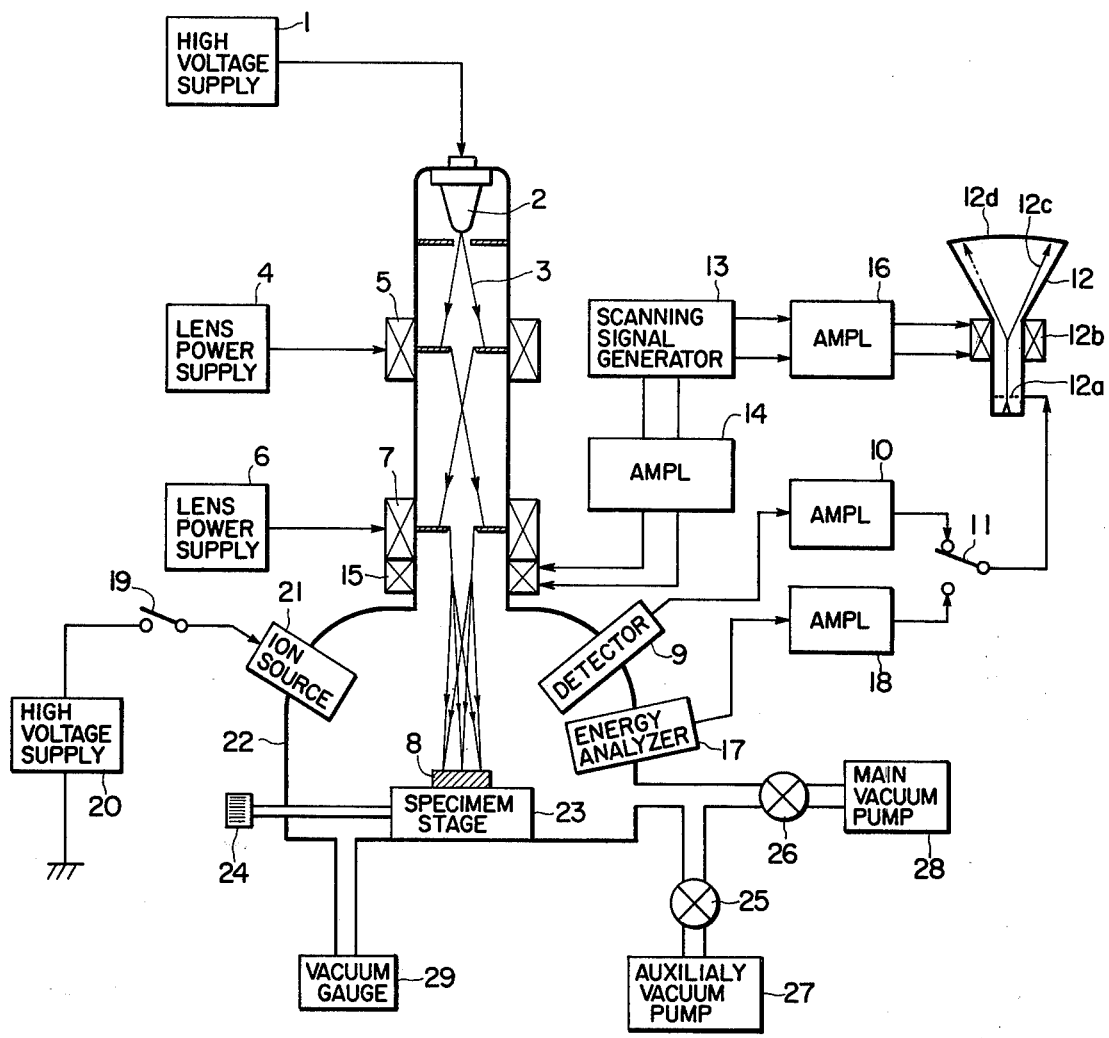
FIG. 1 is a schematic view of apparatus for irradiating a specimen by an electron beam showing an embodiment of this invention.

FIG. 1 shows a preferred embodiment of this invention. Referring to the figure, an electron gun portion 2 is driven by a high voltage supply 1. An electron beam 3 from the electron gun portion 2 is converged onto a specimen 8 by a converging lens 5 which is excited with a lens power supply 4 and by an objective lens 7 which is excited with a lens power supply 6. When the specimen 8 is irradiated by the converged electron beam 3, information signals (secondary electrons, reflected electrons, absorbed electrons, X-rays, cathode luminescence, Auger electrons, etc.) peculiar to the specimen are obtained therefrom. For example, the secondary electrons among them are detected by a detector 9. The secondary electron signal thus detected passes through an amplifier 10 and further through a switch 11, and is introduced into a grid 12a of a cathode-ray tube 12 as a brilliance modulation signal.

A scanning signal generator 13 generates vertical and horizontal scanning signals. These signals are impressed through an amplifier 14 on a deflector 15 which is arranged directly under the objective lens 7. Thus, the electron beam 3 is deflected in two dimensions. In turn, the specimen 8 is two-dimensionally scanned by the converged electron beam 3. On the other hand, the vertical and horizontal scanning signals from the scanning signal generator 13 are also impressed on a deflector 12b of the cathode-ray tube 12 through an amplifier 16. Therefore, a screen 12d of the cathode-ray tube 12 is two-dimensionally scanned in synchronism with the scanning of the specimen 8 by cathode rays, i.e., an electron beam 12c of the cathode-ray tube 12.

The Auger electrons emitted from the specimen 8 are led to an energy analyzer 17 and dispersed here in dependence on their energies, and the Auger electrons of specified energy are detected. The Auger electron signal thus detected is led to an amplifier 18. Further, it is introduced into the grid 12a of the cathode-ray tube 12 as a brilliance modulation signal by changing-over the switch 11. Through the change-over of the switch 11, accordingly, a secondary electron image and an Auger electron image of the scanned area of the specimen 8 can be selectively displayed on the screen 12d of the cathode-ray tube 12.

Upon closure of a switch 19, ions are emitted from an ion source 21 by a high voltage supply 20. Using the ions, the specimen 8 can be etched. The ion etching can be employed in order to analyze a new surface of the specimen 8. The specimen 8 is mounted on a specimen stage 23 inside a specimen chamber 22. The specimen stage 23 can be finely adjusted by manipulating a knob 24 outside the specimen chamber 22.

An auxiliary vacuum pump 27 and a main vacuum pump 28 are connected to the specimen chamber 22 through valves 25 and 26 respectively, and a vacuum gauge 29 is also connected thereto. The auxiliary vacuum pump 27 may be either an oil rotary pump or a sorption pump. The main vacuum pump 28 is a nonvaporative bulk getter vacuum pump.

Now, the valve 25 is opened and the valve 26 is shut, and the auxiliary vacuum pump 27 is actuated. The specimen chamber 22 is thus evacuated preliminarily by the auxiliary vacuum pump 27. When the oil rotary pump is employed as the auxiliary vacuum pump 27, the specimen chamber 22 can be evacuated to the extent of $10^{-1} - 10^{-2}$ Torr. The sorption pump has an evacuating capability of about $10^{-4} - 10^{-5}$ Torr. However, when it is employed as the auxiliary vacuum pump 27, desirably it is stopped at the time when the specimen chamber 22 has reached $10^{-1} - 10^{-2}$ Torr. When the specimen chamber 22 has reached $10^{-1} - 10^{-2}$ Torr or so in this way, the valve 25 is shut and the valve 26 is opened, whereupon the specimen chamber 22 is evacuated by the nonvaporative bulk getter vacuum pump 28 being the main vacuum pump. The degree of arrival vacuum owing to this pump is in the order of $10^{-4} - 10^{-5}$ Torr, and the period of time for attaining such degree of arrival vacuum is as short as several tens seconds - several minutes. When only the nonvaporative bulk getter vacuum pump is employed as the main vacuum pump 28, an inert gas such as argon and helium remains in the specimen chamber 22 without being discharged because this pump exploits the principle of chemical adsorption. Therefore, while the specimen chamber 22 is maintained at the steady vacuum state of approximately $10^{-4} - 10^{-5}$ Torr, the staining of the specimen 8 is effectively prevented. An experiment has revealed that the specimen staining rate at the time when only the nonvaporative bulk getter vacuum pump is employed as the main vacuum pump 28 is less than about 1/10 of that at the time when an oil diffusion pump is employed. The evacuating capability of the nonvaporative bulk getter vacuum pump is gradually lost as the pump is used over a long term, but the rate of staining the specimen rather lowers until approximately $10^{-1} - 10^{-2}$ Torr is reached. However, as the degree of vacuum lowers, the scattering of electrons becomes prone to occur. In practice, therefore, it is desirable that the nonvaporative bulk getter vacuum pump is activated when its evacuating capability has lowered down to approximately $10^{-3}$ Torr. The activation is easily achieved by heating the pump to about 800° - 900° C in a pressure atmosphere of $10^{-1} - 10^{-2}$ Torr or so.

According to the embodiment of FIG. 1, the stains of the specimen are effectively prevented, and the period of time for attaining the steady vacuum is very short. In addition, the activation of the nonvaporative bulk getter vacuum pump can be performed, and hence, the life thereof is rendered long. Further, the stains of the specimen are prevented without intentionally introducing the inert gas such as argon into the specimen chamber, and by exploiting the fact that since only the nonvaporative bulk getter vacuum pump is employed as the main vacuum pump, the inert gas such as argon which is not emitted thereby is left in the specimen chamber. It is therefore understood that the construction is very simple.

Since the nonvaporative bulk getter vacuum pump 28 can evacuate the specimen chamber 22 from the atmospheric pressure to $10^{-4} - 10^{-5}$ Torr, the auxiliary pump 27 is not always necessary. However, in case of using the nonvaporative bulk getter vacuum pump 28 in order to evacuate the specimen chamber from the atmospheric pressure, the number of the operations for activating the pump becomes larger than in the other case, so that also the life shortens. To the end of solving these problems, the use of the preliminary evacuating pump is desirable.

Figure 2:
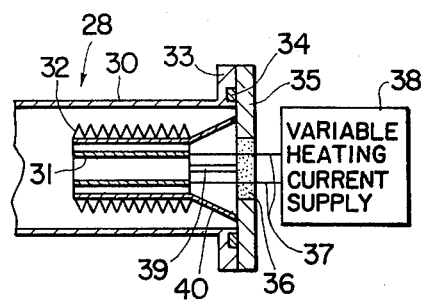
FIGS. 2 through 8 are vertical sectional views showing embodiments of a nonvaporative bulk getter vacuum pump in FIG. 1, and FIGS. 9 and 10 are vertical sectional views of nonvaporative bulk getter vacuum pump units in FIGS. 6 to 8.

FIG. 2 shows an embodiment of the nonvaporative bulk getter vacuum pump in FIG. 1. Referring to FIG. 2, a heater 31 and a nonvaporative bulk getter vacuum pump unit 32 which surrounds the heater 31 are arranged within a tube 30 which is to be connected to the specimen chamber 22 (refer to FIG. 1). The tube 30 is made of a material emitting little gases, for example, stainless steel. The heater 31 consists of a heater wire and a ceramics bobbin round which the heater wire is wound. The nonvaporative bulk getter vacuum pump unit 32 consists of a base which is made of iron, stainless steel, nichrome or the like, and a nonvaporative bulk getter vacuum pump element which is formed on the surface of the base. It is in the shape of bellows as shown in the figure. The nonvaporative bulk getter vacuum pump element may be made of an alloy containing aluminum and zirconium. An end part of the tube 30 is formed with a flange 33, to which a lid 35 is attached through a metal gasket 34 made of gold, copper or the like. A central part of the lid 35 is formed as a hermetic seal 36. The heater 31 is connected to a variable heating current source 38 through lead wires 37 which penetrate the hermetic seal 36 in a vacuum-proof manner. The heater 31 and the nonvaporative bulk getter vacuum pump unit 32 are supported by the lid 35 through supporters 39 and 40, respectively.

When a current is caused to flow from the variable heating current supply 38 through the lead wires 37 to the heater 31, the heater generates heat, whereby the nonvaporative bulk getter vacuum pump unit 32 is heated by radiation. When the temperature of the vacuum pump unit 32 is maintained at about 200° – 400° C by heating the pump unit in this manner, the chemical adsorptivity of the vacuum pump unit 32 increases. Thus, gas molecules floating in the surroundings of the vacuum pump unit 32 are chemically adsorbed, with the result that the surroundings can be steadily maintained at the degree of vacuum of approximately $10^{-4} - 10^{-5}$ Torr. Of course, on account of the chemical adsorption, the inert gas such as argon and helium remains as it is without being adsorbed. Since the nonvaporative bulk getter vacuum pump element exhibits a chemical adsorptivity even at the normal temperature (the capability, however, lowers to some extent), it is not always necessary to heat the element at all times.

The nonvaporative bulk getter vacuum pump unit, especially the nonvaporative bulk getter vacuum pump element included therein loses the chemical adsorptivity gradually through its use over a long term. In such a case, while maintaining the interior of the tube 30 at approximately $10^{-1} - 10^{-2}$ Torr with, e.g., an oil rotary pump, a large current is supplied from the variable heating current supply 38 to the heater 31, to heat the heater so that the nonvaporative bulk getter vacuum pump unit 32 may become about 800° – 900° C. Thus, the gas molecules adsorbed on the surface of the nonvaporative bulk getter vacuum pump element are forced deep into the interior of the element, with the result that the activation of the nonvaporative bulk getter vacuum pump element is achieved in several minutes - several tens minutes.

Figure 3:
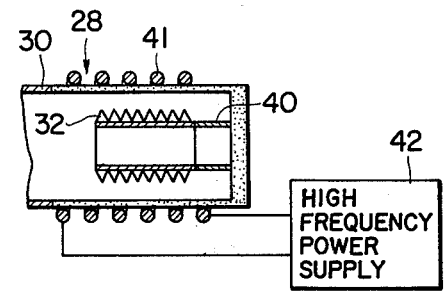

FIG. 3 shows another embodiment of the nonvaporative bulk getter vacuum pump in FIG. 1. Differences of this embodiment from the preceding embodiment in FIG. 2 are that a high-frequency coil 41 is arranged on the outer periphery of the tube 30, the nonvaporative bulk getter vacuum pump unit 32 being heated by bestowing a high frequency thereon from a radio frequency supply 42, and that the tube 30 is accordingly made of a refractory material exhibiting a low radio-frequency loss, for example, ceramics.

According to the embodiment of FIG. 2, the heater is arranged directly in the tube 30, so that in activating the nonvaporative bulk getter vacuum pump element, the heater is oxidized or nitrided by a comparatively large quantity of oxygen or nitrogen in the atmosphere in which it is arranged. In extreme cases, the life of the heater ends due to several activations. Another problem is that, since the nonvaporative bulk getter vacuum pump element is heated by the radiant heat, the heating efficiency is inferior. In order to heat the element to about 800° – 900° C, the temperature of the heater must be raised to above 1,000° C.

According to the embodiment of FIG. 3, the life of the heater need not be feared, but there is the problem that the high-frequency power is required. By way of example, a high-frequency power of over 1 kW is necessary in order to heat the nonvaporative bulk getter vacuum pump element of 1 kg to about 800° – 900° C.

Figure 4:
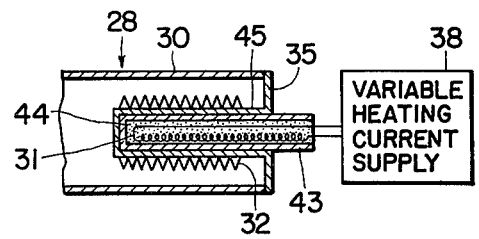

FIG. 4 shows still another embodiment of the nonvaporative bulk getter vacuum pump in FIG. 1. Referring to FIG. 4, the heater 31 is made of a nichrome wire, and it is buried in a refractory material, such as alumina, magnesia and silica, 44 that is packed in a thermally-conductive bottomed tube 43 penetrating the lid 35. The refractory material has the function of shutting off the heater 31 from the open air substantially perfectly, and the function of transferring the heat of the heater 31 to the bottomed tube by conduction. The bottomed tube 43 is inserted in a thermally-conductive bottomed tube 45 in a manner to lie in close contact with the inner wall thereof. An opening part of the bottomed tube 45 is coupled with the central part of the lid 35. The nonvaporative bulk getter vacuum pump unit 32 lies in contact with the outer surface of the bottomed tube 45, and the lid 35 is welded to the open end of the tube 30.

According to the embodiment of FIG. 4, the heat of the heater 31 is transferred to the nonvaporative bulk getter vacuum pump unit 32 through the refractory material 44, bottomed tube 43 and bottomed tube 45 effectively by conduction. Therefore, the temperature of the heater 31 and that of the nonvaporative bulk getter vacuum pump unit 32 become substantially equal. This signifies that the heat transfer efficiency from the heater 31 to the nonvaporative bulk getter vacuum pump unit 32 is very good and that the activation of the nonvaporative bulk getter vacuum pump element can therefore be done by a low power consumption. Since the heater 31 is shut off by the refractory material 44 so as not to come into contact with the atmosphere of the tube 30 or the open air, the oxidation or nitriding as in FIG. 2 lessens to the extreme, with the result that an extraordinarily long life of the heater 31 is achieved. It has been experimentally confirmed that the heater can endure the activating operations 1,000 times or more.

Figure 5:
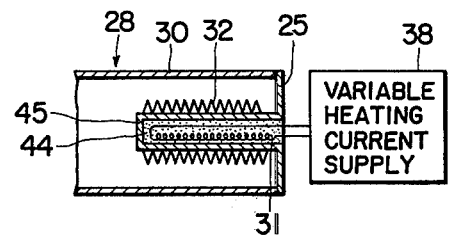

FIG. 5 shows yet another embodiment of the nonvaporative bulk getter vacuum pump in FIG. 1. This embodiment differs from the preceding embodiment of FIG. 4 in that the bottomed tube 43 is omitted, and that the refractory material 44 is packed directly in the bottomed tube 45, the heater 31 being buried therein. With the present embodiment, it is expected to obtain a heat transfer efficiency which is more excellent than in FIG. 4.

Figure 6:
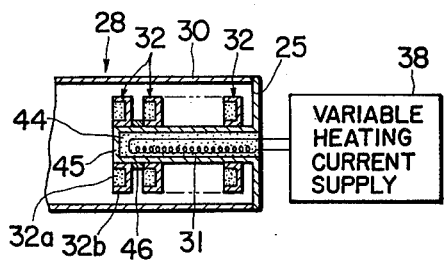

FIG. 6 shows a further embodiment of the nonvaporative bulk getter vacuum pump in FIG. 1. In this embodiment, a plurality of ring-shaped nonvaporative bulk getter vacuum pump units 32 are arranged around the bottomed tube 45 so as to contact with the outer surface thereof. They are disposed through spacers 46 along the axis of the bottomed tube 45. Each of the nonvaporative bulk getter vacuum pump units 32 is made up of a nonvaporative bulk getter vacuum pump element 32a, and a container 32b which is filled up therewith. One side of the container 32b as extends along the axis of the bottomed tube 45 is open, and the other side is closed. The nonvaporative bulk getter vacuum pump element 32a is a porous compact, which is readily obtained by pulverizing aluminum and zirconium and sintering the powdery mixture.

According to the present embodiment, the chemical adsorption area of the nonvaporative bulk getter vacuum pump elements and accordingly the total quantity of adsorption can be made much larger than in the foregoing embodiments of FIGS. 2 to 5.

Figure 7:
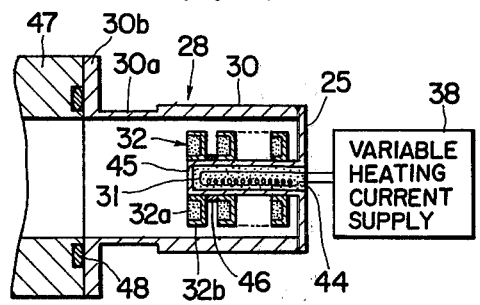

FIG. 7 shows another embodiment of the nonvaporative bulk getter vacuum pump in FIG. 1. A feature of the embodiment shown in FIG. 7 is that a part of the tube 30 close to a tube 47 is formed as a thin-walled portion 30a. According to this embodiment, the temperature rise of the flanges 30b is avoided even at the time of the activation of the nonvaporative bulk getter vacuum pump elements 32a, so that the tube 30 can be connected to the tube 47 through a rubber packing 48.

Figure 8:
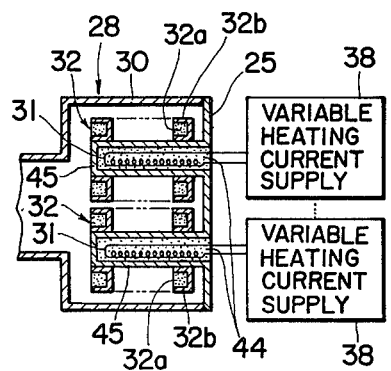

FIG. 8 shows still another embodiment of the nonvaporative bulk getter vacuum pump in FIG. 1. In this embodiment, two of the nonvaporative bulk getter vacuum pump assemblies as shown in FIG. 6 or FIG. 7 are arranged in the tube 30, and the heaters 31 in the assemblies have the respective variable heating current supplies 38 connected thereto.

With the present embodiment, it is expected that the evacuating rate and the total quantity of adsorption will be increased more. Of course, the number of the nonvaporative bulk getter vacuum pump assemblies may be increased as is necessary.

Figures 9, 10:
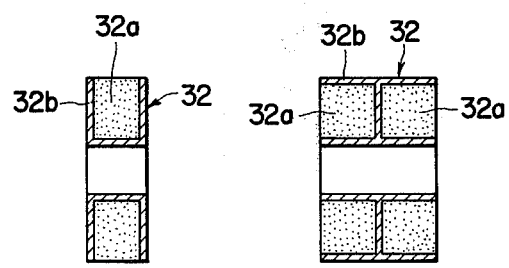

FIGS. 9 and 10 show modifications of the nonvaporative bulk getter vacuum pump units illustrated in FIGS. 6 to 8. These modifications have features in the container 32b when compared with the preceding embodiments of FIGS. 6 to 8. In FIG. 9, the container 32b is open at the outermost periphery. In FIG. 10, it has a partition wall in the middle, and it is open on both sides thereof.

In the embodiments described above, various alterations and modifications can be made without departing from the substance of this invention. It is therefore to be understood that the scope of this invention ought to be defined on the basis of patent claims given below.

I claim:

1. Apparatus for irradiating a specimen by an electron beam, comprising means to generate the electron beam and to irradiate the specimen arranged in a specimen chamber, by said electron beam; means to evacuate said specimen chamber, said means including a nonvaporative bulk getter vacuum pump so as to maintain a steady vacuum of said specimen chamber by only said nonvaporative bulk getter vacuum pump; and means to activate said nonvaporative bulk getter vacuum pump.

2. Apparatus for irradiating a specimen by an electron beam as defined in claim 1, wherein the evacuating means includes a preliminary vacuum pump for evacuating said specimen chamber in a range of from the atmospheric pressure to an intermediate vacuum lower than said steady vacuum.

3. Apparatus for irradiating a specimen by an electron beam as defined in claim 2, wherein said preliminary vacuum pump is an oil rotary pump.

4. Apparatus for irradiating a specimen by an electron beam as defined in claim 2, wherein said preliminary vacuum pump is a sorption pump.

5. Apparatus for irradiating a specimen by an electron beam as defined in claim 1, further comprising means to detect Auger electrons which are obtained from said specimen by irradiating said specimen by said electron beam.

6. Apparatus for irradiating a specimen by an electron beam as defined in claim 1, further comprising means to detect secondary electrons which are obtained from said specimen by irradiating said specimen by said electron beam.

7. Apparatus for irradiating a specimen by an electron beam as defined in claim 5, further comprising means to subject said specimen to ion etching.

8. Apparatus for irradiating a specimen by an electron beam as defined in claim 6, further comprising means to subject said specimen to ion etching.

9. Apparatus for irradiating a specimen by an electron beam as defined in claim 2, wherein said steady vacuum falls within a range of $10^{-5} - 10^{-6}$ Torr, and said intermediate vacuum falls within a range of $10^{-1} - 10^{-2}$ Torr.

* * * * *